United States Patent
Ishikawa et al.

(10) Patent No.: US 7,483,250 B2
(45) Date of Patent: Jan. 27, 2009

(54) DRIVE CIRCUIT FOR SWITCHING DEVICE

(75) Inventors: Katsumi Ishikawa, Tokyo (JP); Masataka Sasaki, Tokyo (JP); Koichi Suda, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/546,360

(22) Filed: Oct. 12, 2006

(65) Prior Publication Data

US 2007/0030615 A1 Feb. 8, 2007

Related U.S. Application Data

(63) Continuation of application No. 10/784,161, filed on Feb. 24, 2004, now Pat. No. 7,126,802.

(30) Foreign Application Priority Data

Jun. 10, 2003 (JP) .............................. 2003-165579

(51) Int. Cl.
H02H 3/00 (2006.01)
H02H 3/08 (2006.01)
H02H 9/02 (2006.01)

(52) U.S. Cl. .................... 361/93.1; 361/87; 361/101
(58) Field of Classification Search ............ 361/93.1, 361/87, 101
See application file for complete search history.

(56) References Cited

U.S. PATENT DOCUMENTS

| 4,823,056 | A | 4/1989 | Watanabe et al. |
| 5,200,878 | A | 4/1993 | Sasagawa et al. |
| 5,210,479 | A * | 5/1993 | Kimura et al. ............. 318/727 |
| 6,057,728 | A | 5/2000 | Igarashi |
| 6,580,627 | B2 | 6/2003 | Toshio |
| 6,717,785 | B2 * | 4/2004 | Fukuda et al. ............. 361/93.1 |

FOREIGN PATENT DOCUMENTS

| JP | 62-6529 A | 1/1987 |
| JP | 02-282826 | 10/1990 |
| JP | 04-079758 | 3/1992 |
| JP | 2003-134797 A | 5/2003 |
| JP | 2003-169715 | 6/2003 |

\* cited by examiner

*Primary Examiner*—Stephen W Jackson
*Assistant Examiner*—Zeev Kitov
(74) *Attorney, Agent, or Firm*—Crowell & Moring LLP

(57) ABSTRACT

A drive circuit that controls a switching device ON/OFF and a soft cutoff command circuit that gradually decreases the gate terminal voltage of the switching device when short circuit of the switching device is detected. Additionally, an ON-pulse retention command circuit retains the output of the drive circuit ON when the gate terminal voltage is judged to have exceeded a specified value by a gate voltage judgment comparator that detects the gate terminal voltage of the switching device.

2 Claims, 6 Drawing Sheets

(A) PWM SIGNAL
(B) ON-PULSE RETENTION SIGNAL
(C) DRIVE CIRCUIT OUTPUT SIGNAL
(D) GATE VOLTAGE
(E) MAIN IGBT CURRENT
(F) SENSE VOLTAGE (FILTERED)

US 7,483,250 B2

DRIVE CIRCUIT FOR SWITCHING DEVICE

This application is a continuation of U.S. Ser. No. 10/784,161, filed Feb. 26, 2004 now U.S. Pat. No. 7,126,802, which claims priority to JP 2003-165579, filed Jun. 10, 2003, the contents of each of which are incorporated by reference herein in their entirety.

BACKGROUND AND SUMMARY OF THE INVENTION

The present invention relates to a drive circuit for a voltage driven switching device.

When a semiconductor switching device, such as insulated gate type bipolar transistor (IGBT), is used for driving a motor, and if arm short circuit or short circuit of load is caused, the collector current of the IGBT increases quickly and consequently the IGBT is broken down due to overcurrent or heat. It, therefore, is necessary to detect a short circuit state in a short time. When classifying roughly, there are two major known methods of detecting the short circuit. One is a method, as disclosed in the Japanese Application Patent Laid-open Publication No. Hei 04-79758, where a current sense IGTB is used to detect the short circuit current. The other is a method, as disclosed in the Japanese Application Patent Laid-open Publication No. Hei 02-262826, where the collector voltage is monitored to detect the short circuit state.

On the other hand, there remains a problem that, if current is cut off quickly in a short circuit state, the rate of current change—dI/dt becomes greater and consequently the spike voltage, which is defined by the product of the rate and the stray inductance, becomes greater, resulting in the breakdown of the IGBT. To prevent this, the method disclosed in the Japanese Application Patent Laid-Open Publication Nos. Hei 04-79758 and 02-262826 is provided with a soft cutoff function so as to cut off the main IGBT slowing in the case short circuit is detected.

SUMMARY OF THE INVENTION

According to the method disclosed in the Japanese Application Patent Laid-open Publication No. Hei 04-79758 and 02-262826, however, because the short circuit detection circuit is provided with a delay time for preventing malfunction due to noise, there is a time delay of 1 to 2 μs before the soft cutoff function operates. Because of the above, there remains a problem that, if a turn-OFF command signal is inputted during the delay time of 1 to 2 μs before the soft cutoff function operates, the main circuit current is cut off quickly and that the rate of current change —dI/dt at the cutoff becomes greater and consequently the spike voltage, defined by the product of the rate and the stray inductance, becomes greater, resulting in the breakdown of the IGBT. An example of the above explanation that a turn-OFF command signal is inputted during the delay time of 1 to 2 μs before the soft cutoff function operates can be a case where noise superimposes a PWM signal. Because noise is a narrow pulse of about 1 μs, an end portion of the noise may be incorrectly recognized as a turn-OFF signal.

An object of the present invention is to offer such drive circuit for a switching device that can operate a soft cutoff function when short circuit is detected and also can be prevented from breakdown even if a narrow pulse is inputted.

(1) In order to realize the above object, the present invention constructs a drive circuit for a switching device, comprising a drive circuit that controls the switching device ON/OFF, a short circuit detection means that detects short circuit of the switching device, and a soft cutoff means that gradually decreases the gate terminal voltage of the switching device when short circuit is detected by the short circuit detection means; equipped with a gate voltage detection means that detects the gate terminal voltage of the switching device, and an ON-pulse retention means that retains the drive circuit output ON when the gate terminal voltage detected by the gate voltage detection means exceeds a specified value.

With this construction, it becomes possible to operate the soft cutoff function when short circuit is detected and also to prevent breakdown even if a narrow pulse is inputted while the drive circuit output is retained ON.

(2) In (1) above, it is preferable that the drive circuit further comprises a gate voltage clamp means that clamps the gate voltage of the switching device, wherein the gate voltage clamp means is operated by an output signal of the ON-pulse retention means.

(3) In (1) above, it is preferable that the switching device is one with voltage driven sense function, which is provided with a gate terminal, terminal No. 1, terminal No. 2, and terminal No. 3, where the main current is applied between the terminal No. 1 and terminal No. 2 and the sense current in proportion to the main current is applied between the terminal No. 1 and terminal No. 3 by applying voltage to the gate terminal, and the ON-pulse retention means retains the drive circuit output ON when the gate terminal voltage detected by the gate voltage detection means exceeds a specified value and also the sense voltage of a sense resistor, connected in series to the terminal No. 3 of the switching device, exceeds a specified value.

(4) In (1) above, it is preferable that the drive circuit further comprises a pulse width extension means that extends the pulse width of a pulse signal inputted to the drive circuit.

DETAILED DESCRIPTION OF THE INVENTION

Figure 1:
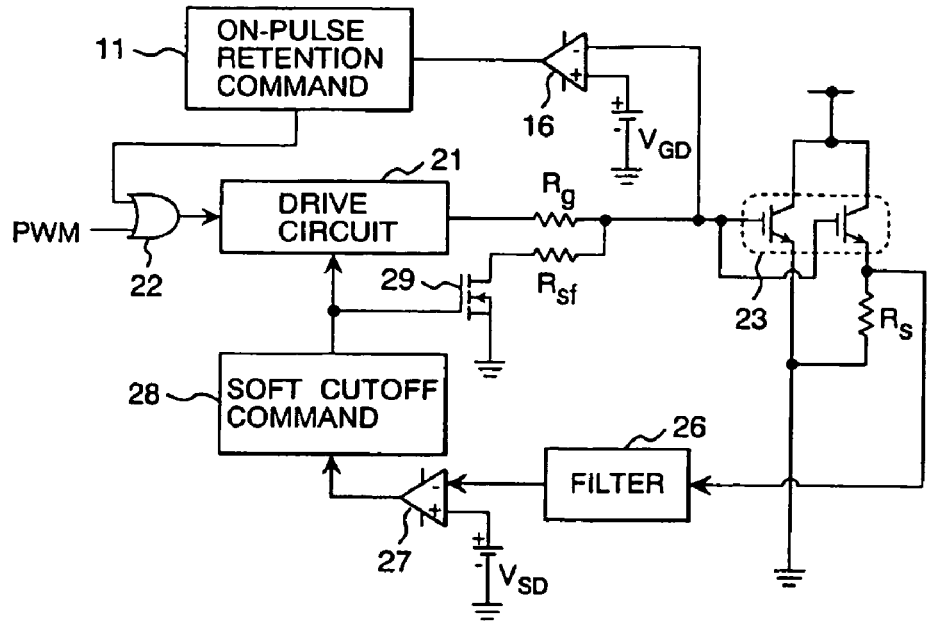
FIG. 1 is circuit block diagram showing the construction of the drive circuit of a switching device according to the first embodiment of the invention
Figure 2:
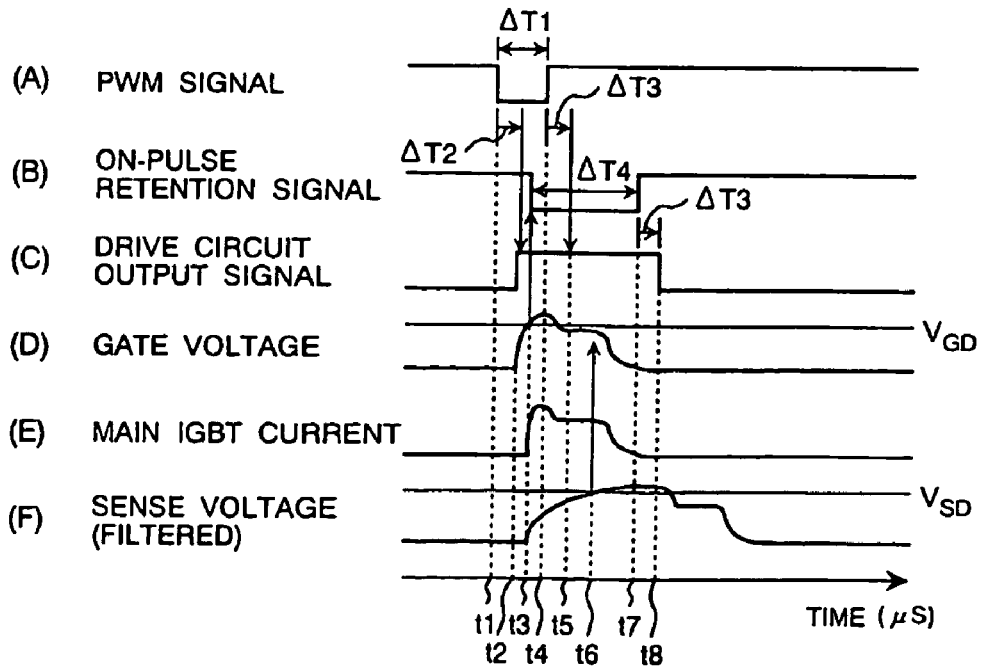
FIG. 2 is time chart showing the operation of the drive circuit of a switching device according to the first embodiment of the invention

The construction and operation of the drive circuit of a switching device according to the first embodiment of the invention are described hereunder, using FIG. 1 and FIG. 2.

FIG. 1 is a circuit block diagram showing the construction of the drive circuit of the switching device according to the first embodiment of the invention.

In this embodiment, IGBT 23 with sense function is used as a switching device. In the IGBT 23, the main current can be applied between the terminal No. 1 (collector terminal) and terminal No. 2 (emitter terminal) and the sense current, which is one-hundredths to one-thousandths of the main current, can be applied between the terminal No. 1 (collector terminal) and terminal No. 3 (sense emitter terminal). The drive circuit 21A is connected to the gate terminal of the IGBT through gate resistor Rg, and the drive circuit 21 has a function of setting the IGBT 23 ON/OFF when a PWM input signal is transmitted.

Besides, a sense resistor Rs is connected to the terminal No. 3 (emitter terminal) in series with the ground. A short circuit judgment comparator 27 measures the voltage of the sense resistor Rs and judges as short-circuited when the voltage of the sense resistor Rs is higher than a reference voltage (sense voltage detection level) VSD. When the short circuit judgment comparator 27 judges as short-circuited, a soft cutoff command circuit 28 stops setting the drive circuit 21 ON/OFF, sets the nMOS 29 for soft cutoff ON, and also decreases the gate voltage gradually by a resistor Rsf for soft cutoff so as to cut off the current through the IGBT slowly. Because of this, the spike voltage defined by the product of the rate of current change—dI/dt at the cutoff and the stray inductance can be lowered.

A high-frequency noise is generated in the voltage of the sense resistor Rs due to noise of switching or because of lengthy wiring up to the short circuit judgment comparator 27. There is, therefore, provided a filter circuit 26 for eliminating the noise between the sense resistor Rs and short circuit judgment comparator 27. The filter circuit 26 has a characteristic that the output voltage rises slowly with a delay of 1 to 2 µs even if the input voltage, which is the voltage of the sense resistor Rs, rises quickly.

When a 10 kHz signal is employed as the PWM signal, one cycle of the PWM signal is 100 µs. Because the on-duty minimum of the PWM signal is generally set to 2 to 3%, the minimum pulse width of the ON-pulse of the PWM signal is 2 to 3 µs. Adding the filter circuit 26, therefore, does not cause any problem because, when a PWM signal of 2 to 3 µs is inputted, the delay of the soft cutoff command is no more than 1 to 2 µs. If a narrow signal of 1 to 2 µs, such as a noise signal, is inputted, however, the OFF command signal of the PWM and the soft cutoff command signal compete with each other and the IGBT 23 may be broken-down.

This embodiment, therefore, are provided with a gate voltage judgment comparator 16 and an ON-pulse retention command circuit 11 as a countermeasure against narrow pulse. An ON-pulse retention signal outputted from the ON-pulse retention command circuit 11 is inputted to the drive circuit 21 via an OR circuit 22.

If arm short circuit is caused, the gate voltage is charged in excess of the supply voltage and consequently current through the IGBT quickly increases as the gate voltage increases. For this reason, measuring the gate voltage is the earliest way to judge whether the device is short-circuited or not. The gate voltage judgment comparator 16 is a circuit that monitors the gate voltage. When the gate voltage exceeds the reference voltage (gate voltage detection level) VGD, the gate voltage judgment comparator 16 judges arm short circuit has been caused. For planar IGBT, the gate voltage detection level VGD is set approximately to the supply voltage (15V) of the drive circuit. For trench gate IGBT, however, because the saturation current is extremely high, it is set to a level lower than the supply voltage. For example, if the threshold of the IGBT is about 6V, the level is set to about 14V for planar IGBT, and to about 9V for trench gate IGBT. In short, it is preferable that the level be set to 9 to 14V.

Next, the operation of the drive circuit of the switching device according to this embodiment is described, using FIG. 2.

FIG. 2 is a time chart showing the operation of the drive circuit of the switching device according to the first embodiment of the invention. FIG. 2 shows the operation in the case where arm short circuit is caused when a narrow pulse is inputted. The horizontal axis of FIG. 2 represents the time. FIG. 2 (A) represents a PWM signal inputted to the drive circuit 21. FIG. 2 (B) represents an ON-pulse retention signal outputted from the ON-pulse retention command circuit 11. FIG. 2 (C) represents an output signal of the drive circuit 21. FIG. 2 (D) represents the gate voltage of the IGBT 23. FIG. 2 (E) represents the main IGBT current through the IGBT 23. FIG. 2 (F) represents the sense voltage, an output of the filter circuit 26.

It is assumed that, as shown in FIG. 2 (A), a narrow pulse due to noise is inputted as a PWM signal. It is also assumed that the PWM signal is set ON at the trailing edge and set OFF at the leading edge of the pulse signal. In other words, the PWM signal is set ON at time t1 and set OFF at time t4. The pulse width $\Delta T1$ of the PWM signal is set, for example, to 1 µs. Since the minimum ON-time of normal PWM signal is set to 2 to 3 µs, a narrow pulse of 1 µs is nothing but one generated by noise or something like that.

While the PWM signal is inputted to the drive circuit 21 via the OR circuit 22, the drive circuit 21 is provided with a delay time for turn-ON and turn-OFF. That is, when the PWM signal falls at time t1 as shown in FIG. 2 (A), the output signal of the drive circuit 21 delays by time $\Delta T2$ and turns ON at time t2 as shown in FIG. 2 (C). When the PWM signal rises at time t4 as shown in FIG. 2 (A), the output signal of the drive circuit 21 delays by time $\Delta T3$ and turns OFF. The delay time $\Delta T2$ and $\Delta T3$ for turn-ON and turn-OFF is, for example, 0.5 µs.

When the output signal of the drive circuit 21 turns ON at time t2 as shown in FIG. 2 (C), the gate voltage of the IBGT begins increasing at time t2 as shown in FIG. 2 (D).

If arm short circuit is caused during the above operation, the gate voltage is charged in excess of the supply voltage as shown in FIG. 2 (D). Consequently, the gate voltage exceeds the gate voltage detection level VGD. As the gate voltage increases, current through the IGBT also increases quickly as shown in FIG. 2 (E). Because of the delay action of the filter 23 for noise prevention, the sense voltage, which is the output of the filter 23, increases with delay as shown in FIG. 2 (F).

If arm short circuit is caused, since the gate voltage exceeds the gate voltage detection level VGD at time t3 as shown in FIG. 2 (D), the gate voltage judgment comparator 16 detects as short-circuited and the ON-pulse retention command circuit 11 outputs an ON-pulse retention signal at time t3 as shown in FIG. 2 (B). A one-shot multi-vibrator, for example, can be employed as the ON-pulse retention command circuit 11 and the pulse width $\Delta T4$ of the ON-pulse retention signal is set, for example, to 2 to 3 µs.

The drive circuit 21 determines the output signal shown in FIG. 2 (C) based on the logical OR of the PWM signal shown in FIG. 2 (A) and the ON-pulse retention signal shown in FIG.

2 (B). The delay time ΔT2 and ΔT3 for turn-ON and turn-OFF is as mentioned above. When the ON-pulse retention signal turns OFF at time t7, the drive circuit output signal turns OFF at time t8. Because of this, as shown in FIG. 2 (C), the drive circuit 21 continues outputting the ON-pulse even after time, which is the time the turn-OFF delay time has elapsed since the PWM signal turned OFF at time t4. Accordingly, as shown in FIG. 2 (D), the gate voltage does not go OFF even after time t5.

If the sense voltage exceeds the sense voltage detection level VSD, for example, at time t6 as shown in FIG. 2 (F), the short circuit judgment comparator 27 judges as short-circuited. Then, the soft cutoff command circuit 28 stops setting the drive circuit 21 ON/OFF, sets the nMOS 29 for soft cutoff ON, and decreases the gate voltage gradually by a resistor Rsf for soft cutoff so as to cut off the current trough the IGBT slowly as shown in FIG. 2 (E). Because of this, the spike voltage defined by the product of the rate of current change—dI/dt at the cutoff and the stray inductance can be lowered.

Thus, providing the gate voltage judgment comparator 16 and ON-pulse retention command circuit 11 makes it possible to surely protect the device from short circuit even if a narrow pulse is inputted upon short circuit.

Now, brief explanation is given hereunder on a case that no ON-pulse retention command circuit 11 is provided. If no ON-pulse retention command circuit 11 is provided, assuming that a narrow pulse falls at time t1 and rises at time t4 as shown in FIG. 2 (A), the output signal of the drive circuit is set ON at time t2 and set OFF at time t5 as shown in FIG. 2 (C). On the other hand, if the sense voltage exceeds the level VSD as shown in FIG. 2 (F) and short circuit to the ground is detected, the soft cutoff function operates.

This means that the turn-OFF command is inputted at time t5 before the soft cutoff command is inputted. Consequently, because the gate voltage is decreased at a normal switching speed, the gate voltage cuts off the main circuit current at high speed. Thus, the spike voltage defined by the product of the rate of current change—dI/dt at the cutoff and the stray inductance increases and the IGBT may be broken-down.

Although the ON-time ΔT4 of the ON-pulse retention signal outputted from the ON-pulse retention command circuit 11 is set to 2 to 3 μs, it can be anything shorter than the short circuit durability of the IGBT 23. For example, if the short circuit durability of the IGBT is 10 μs, the ON-time must be shorter than this. Although the gate voltage is retained at a high level during the time while the ON-pulse is retained, the IGBT can be prevented from breakdown if the time is shorter than the short circuit durability and the soft cutoff function operates before the short circuit durability time has elapsed.

As described above, by retaining the ON-pulse, this embodiment enables to surely protect the device from short circuit even if a narrow pulse is inputted upon short circuit.

Figure 3:
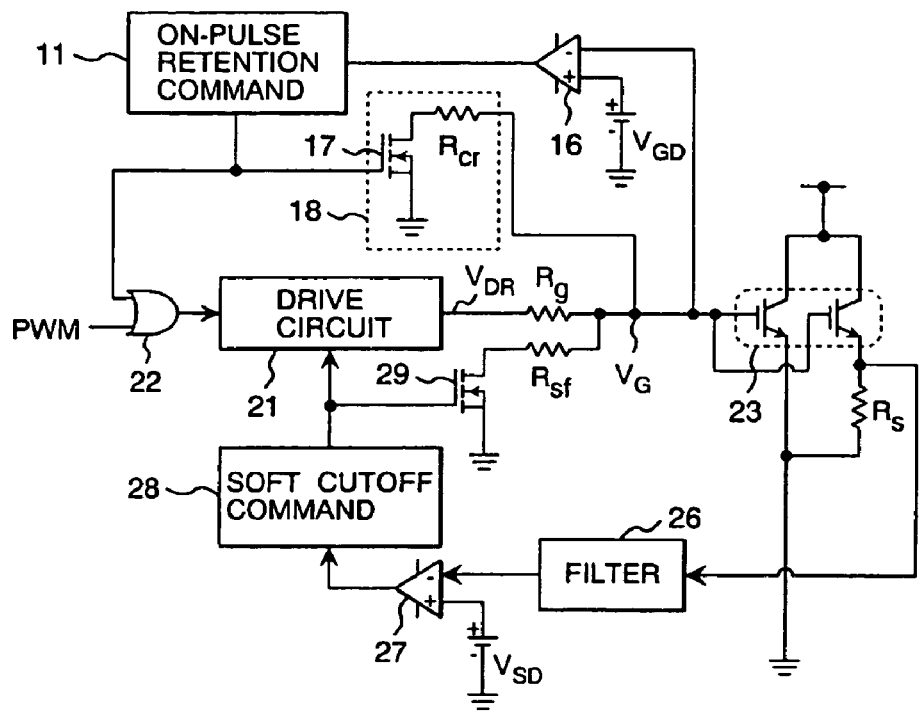
FIG. 3 is circuit block diagram showing the construction of the drive circuit of a switching device according to the second embodiment of the invention
Figure 4:
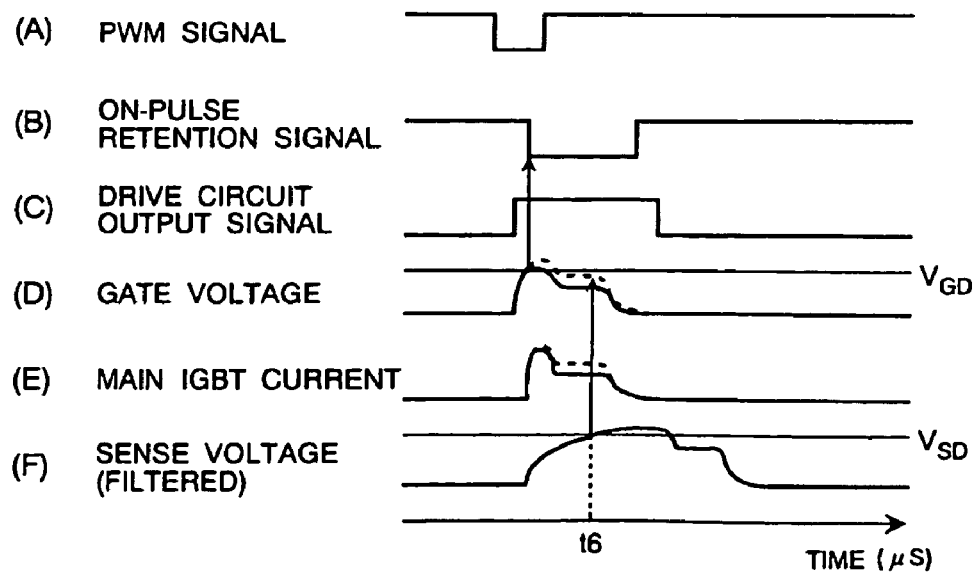
FIG. 4 is time chart showing the operation of the drive circuit of a switching device according to the second embodiment of the invention

Next, the construction and operation of the drive circuit of a switching device according to the second embodiment of the invention are described, using FIG. 3 and FIG. 4.

To begin with, the construction and operation of the drive circuit switching device according to this embodiment is described, using FIG. 3.

FIG. 3 is a circuit block diagram showing the construction of the drive circuit of the switching device according to the second embodiment of the invention. The same symbol as in FIG. 1 denotes the same part.

In this embodiment, in addition to the construction shown in FIG. 1, there is provided a voltage clamp circuit 18, comprising a gate voltage clamp nMOS 17 and a gate voltage clamp resistor Rcr. When the gate clamp nMOS 17 is set ON, the gate voltage VG of the IGBT 23 is retained at a voltage (VDR×(Rcr/(Rcr+Rg))), which is the output voltage VDR of the drive circuit divided by the resistor Rg and resistor RCR. Given that the output voltage VDR of the drive circuit 21 is 15V, the resistance of the gate voltage clamp resistor Rcr is so set that the clamp voltage is 10 to 12V. Besides, the clamp voltage is set lower than the gate voltage detection level VGD.

Next, the operation of the drive circuit of the switching device according to this embodiment is described, using FIG. 4.

FIG. 4 is a time chart showing the operation of the drive circuit of the switching device according to the second embodiment of the invention. FIG. 4 shows the operation in the case where arm short circuit is caused when a narrow pulse is inputted. The horizontal axis of FIG. 4 represents the time. FIG. 4 (A) represents a PWM signal inputted to the drive circuit 21. FIG. 4 (B) represents an ON-pulse retention signal outputted from the ON-pulse retention command circuit 11. FIG. 4 (C) represents an output signal of the drive circuit 21. FIG. 4 (D) represents the gate voltage of the IGBT 23. In FIG. 4 (D), broken line represents the gate voltage in the case of using no gate voltage clamp circuit 18, which is equivalent to FIG. 2 (D). Bold line in FIG. 4 (D) represents the gate voltage in the case where the clamp circuit 18 functions. FIG. 4 (E) represents the main IGBT current through the IGBT 23. FIG. 2 (F) represents the sense voltage, an output of the filter circuit 26.

If arm short circuit is caused, the gate voltage exceeds the gate voltage detection level as shown in FIG. 4 (F), the gate voltage judgment comparator 16 judges as short-circuited, and an ON-pulse retention signal is outputted as shown in FIG. 4 (B). The drive circuit 21 determines the drive circuit output signal based on the logical OR of the PWM signal and ON-pulse retention signal. Consequently, as shown in FIG. 4 (C), it continues outputting the ON-pulse even after the PWM signal turns to an OFF command.

In this embodiment, the gate voltage clamp circuit 18 is provided additionally, and hence the gate voltage is lowered during the ON-pulse signal as shown by bold line in FIG. 4 (D). Because of this, the short circuit current of the IGBT can be decreased as shown by bold line in FIG. 4 (E).

When a trench gate IGBT is used, the saturation current is about ten times as high as the rated current. With the above method, however, the current through the IGBT upon short circuit can be decreased to about a half.

In this embodiment, because the gate voltage clamp circuit 18 is provided in addition to the gate voltage judgment comparator 16 and ON-pulse retention command circuit 11 as described above, it becomes possible even in the case of short circuit caused by a short PWM signal input not only to surely protect the device from short circuit but also to decrease the short circuit current. Accordingly, this embodiment further improves the safety as compared to the embodiment shown in FIG. 1.

Figure 5:
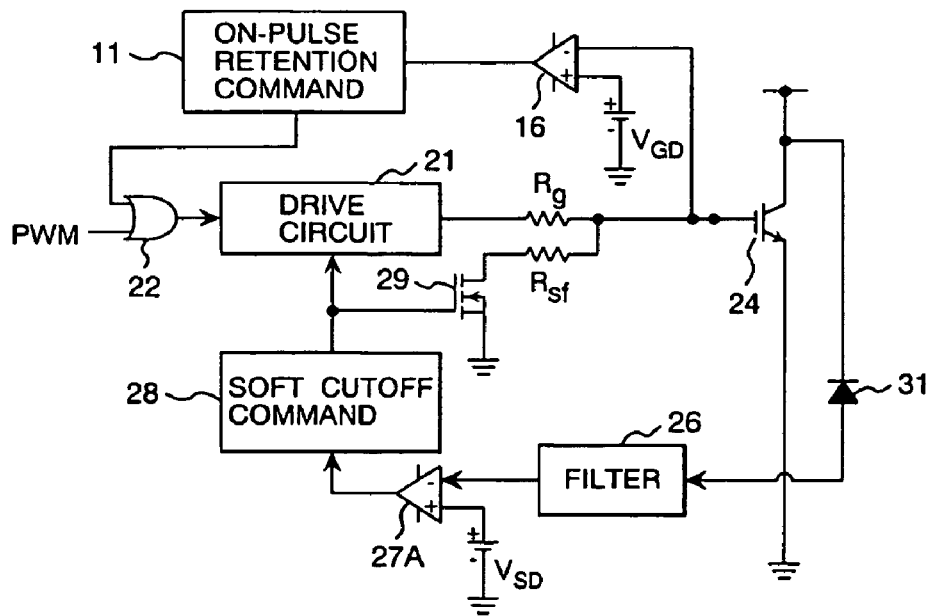
FIG. 5 is circuit block diagram showing the construction of the drive circuit of a switching device according to the third embodiment of the invention

Next, the construction and operation of the drive circuit of a switching device according to the third embodiment of the invention are described, using FIG. 5.

FIG. 5 is a circuit block diagram showing the construction of the drive circuit of the switching device according to the third embodiment of the invention. The same symbol as in FIG. 1 denotes the same part.

In this embodiment, an IGBT 24 is used in place of the IGBT 23 with sense function that is used in the embodiment shown in FIG. 1. While, in the embodiment shown in FIG. 1, the sense current is detected for the protection of the device from short circuit, a short circuit judgment comparator 27A in this embodiment monitors the anode voltage of a high-voltage diode 31 and judges as short-circuited if it is higher than a specified voltage VAD.

This embodiment is also provided with a gate voltage judgment comparator 16 and an ON-pulse retention command circuit 11. If arm short circuit is caused when a narrow pulse signal is inputted, the gate voltage exceeds the gate voltage detection level, the gate voltage judgment comparator 16 detects short circuit, and the ON-pulse retention command circuit operates. The drive circuit 21 determines the drive circuit output signal based on the logical OR of the PWM signal and ON-pulse retention signal. Consequently, it continues outputting the ON-pulse even after the PWM signal turns to an OFF command. Then, the short circuit judgment comparator 27A judges as short-circuited, and the soft cutoff command circuit 28 stops setting the drive circuit 21 ON/OFF, sets the nMOS 29 for soft cutoff ON, and decreases the gate voltage gradually by a resistor Rsf for soft cutoff. The current trough the IGBT, therefore, can be cut off slowly and the spike voltage can be lowered.

With this embodiment, even in the case of short circuit caused by a narrow pulse input, the device can be protected from short circuit by retaining the ON-pulse as described above.

Figure 6:
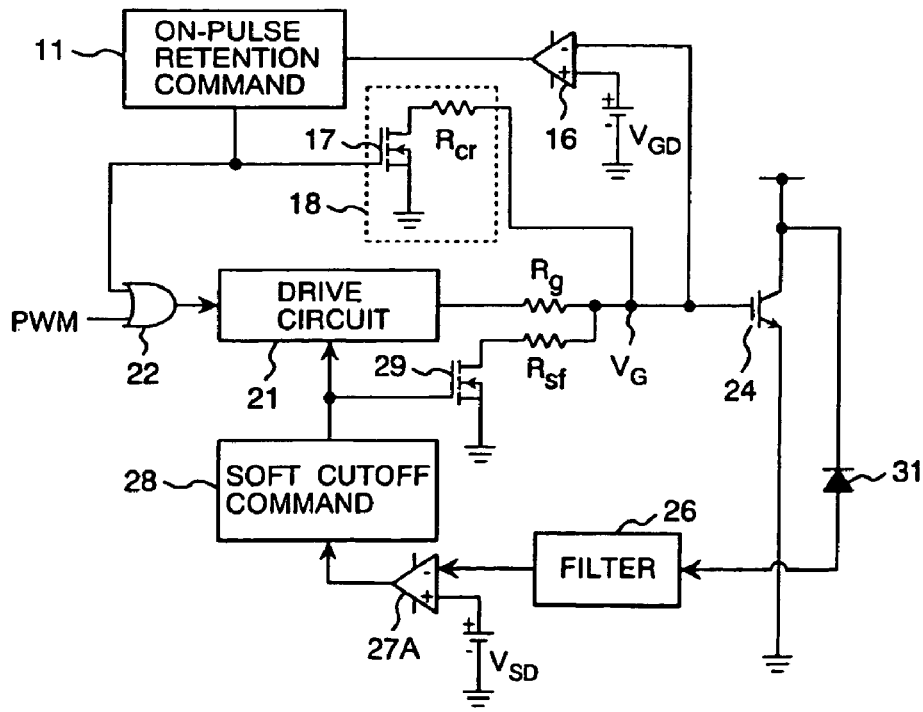
FIG. 6 is circuit block diagram showing the construction of the drive circuit of a switching device according to the fourth embodiment of the invention

Next, the construction and operation of the drive circuit of a switching device according to the fourth embodiment of the invention are described, using FIG. 6.

FIG. 6 is a circuit block diagram showing the construction of the drive circuit of the switching device according to the fourth embodiment of the invention. The same symbol as in FIG. 5 denotes the same part.

In this embodiment, in addition to the gate voltage judgment comparator 16 and ON-pulse retention command circuit 11 in the embodiment shown in FIG. 5, there is provided a voltage clamp circuit 18, comprising a gate voltage clamp nMOS 17 and a gate voltage clamp resistor Rcr. The construction and operation of the voltage clamp circuit 18 are the same as explained for FIG. 3.

If arm short circuit is caused by a narrow pulse signal input, the gate voltage exceeds the gate voltage detection level, the gate voltage judgment comparator 16 judges as short-circuited and an ON-pulse retention signal functions. The drive circuit 21 determines the drive circuit output signal based on the logical OR of the PWM signal and ON-pulse retention signal. Consequently, it continues outputting the ON-pulse even after the PWM signal turns to an OFF command. In addition, in this embodiment, by providing the gate voltage clamp circuit 18, the gate voltage is lowered during the ON-pulse retention signal. Because of this, the short circuit current of the IGBT can be decreased.

With this embodiment, it becomes possible not only to protect the device from short circuit caused by a short PWM signal input but also to decrease the short circuit current, and hence improve the safety.

Figure 7:
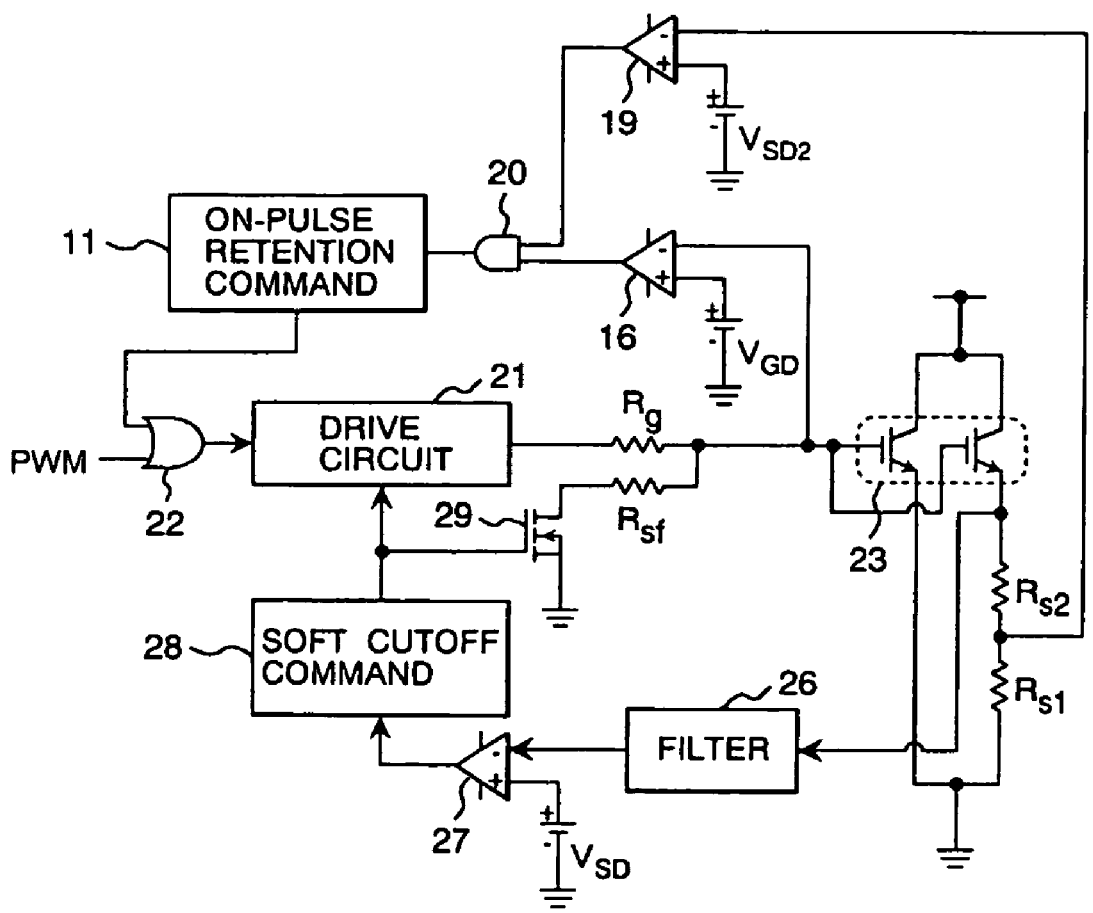
FIG. 7 is circuit block diagram showing the construction of the drive circuit of a switching device according to the fifth embodiment of the invention

Next, the construction and operation of the drive circuit of a switching device according to the fifth embodiment of the invention are described, using FIG. 7.

FIG. 7 is a circuit block diagram showing the construction of the drive circuit of the switching device according to the fifth embodiment of the invention. The same symbol as in FIG. 1 denotes the same part.

In this embodiment, sense resistors Rs1 and Rs2 are connected in series with the ground. The voltage of these sense resistors Rs1 and Rs2 are measured for a short circuit judgment comparator 27 to judge whether the device is short-circuited or not. In addition, there are provided a sense voltage judgment comparator 19 and an AND circuit 20. The sense voltage judgment comparator 19 measures the voltage of the sense resistor Rs1 and judges as short-circuited if it is higher than a specified voltage VSD2.

In this embodiment, therefore, whether both sense voltage judgment comparator 19 and gate voltage judgment comparator 16 have detected short circuit is judged by the AND circuit 20, and if so judged, the ON-pulse retention command signal circuit 11 operates, and the ON-pulse retention signal is outputted. Because of monitoring the IGBT current and gate voltage at the same time as well as retaining the ON-pulse, it becomes possible even in the case of short circuit caused by a narrow pulse signal input to further surely protect the device from short circuit.

Figure 8:
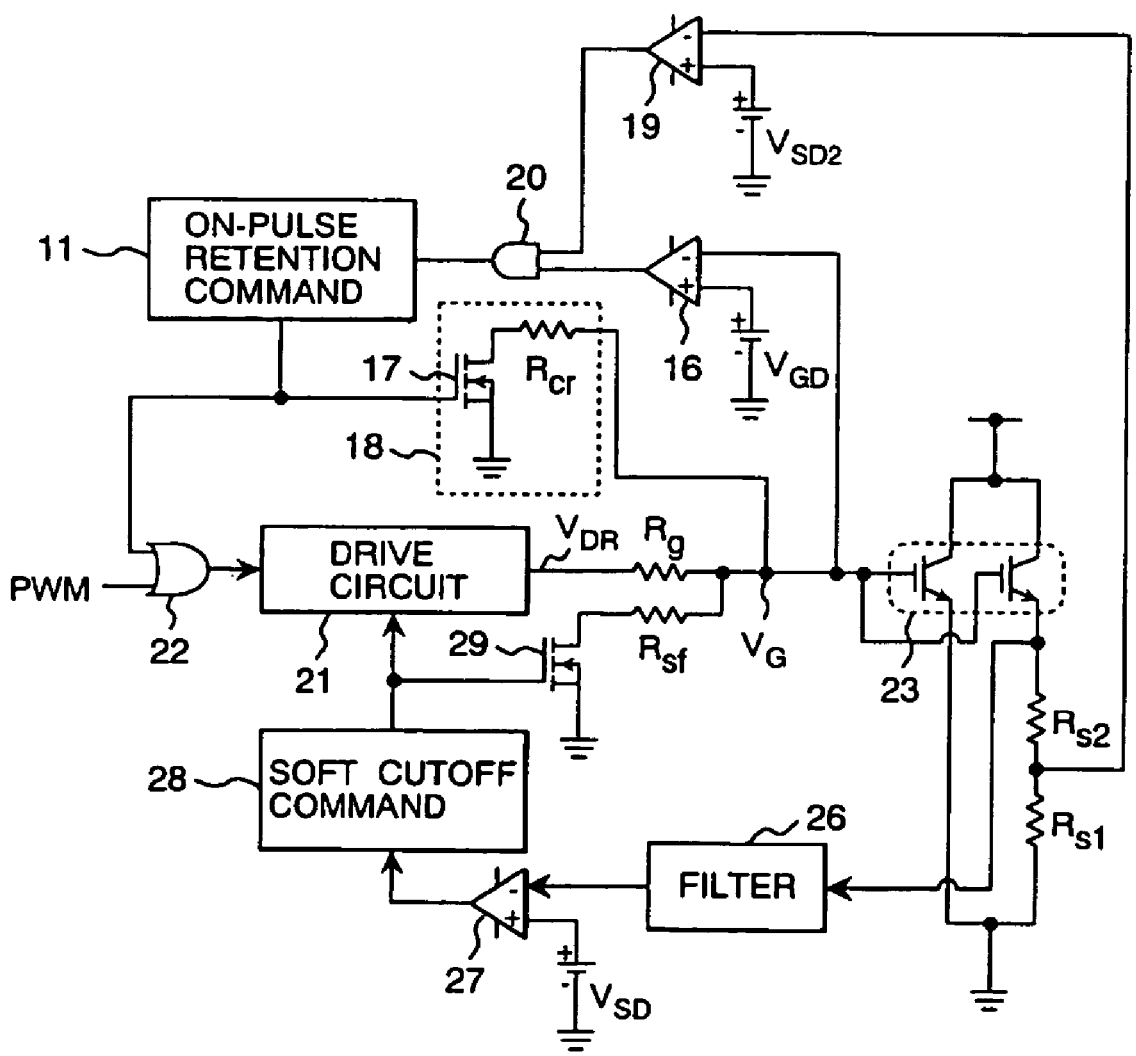
FIG. 8 is circuit block diagram showing the construction of the drive circuit of a switching device according to the sixth embodiment of the invention

Next, the construction and operation of the drive circuit of a switching device according to the sixth embodiment of the invention are described, using FIG. 8.

FIG. 8 is a circuit block diagram showing the construction of the drive circuit of the switching device according to the fifth embodiment of the invention. The same symbol as in FIG. 7 denotes the same part.

In this embodiment, in addition to the gate voltage judgment comparator 16 and ON-pulse retention command circuit 11 in the embodiment shown in FIG. 7, there is provided a voltage clamp circuit 18. The construction and operation of the voltage clamp circuit 18 are the same as explained for FIG. 3.

With this embodiment, by lowering the gate voltage during the ON-pulse retention signal, the short circuit current through the IGBT can also be decreased. Accordingly, it becomes possible not only to protect the device from short circuit caused by a narrow pulse signal input but also to decrease the short circuit current.

Figure 9:
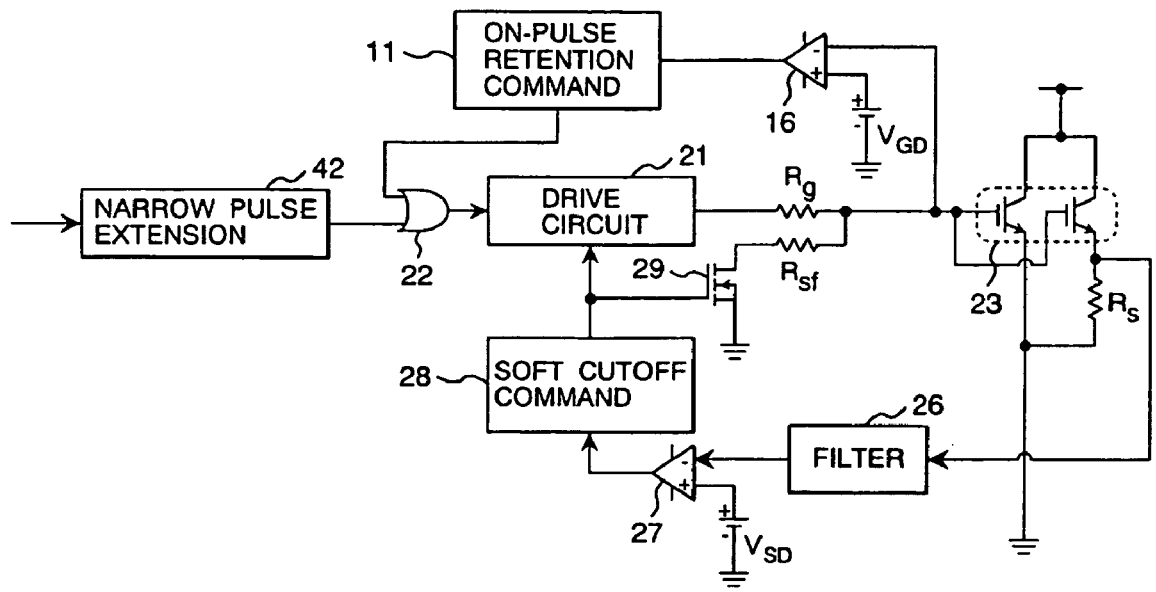
FIG. 9 is circuit block diagram showing the construction of the drive circuit of a switching device according to the seventh embodiment of the invention
Figure 10:
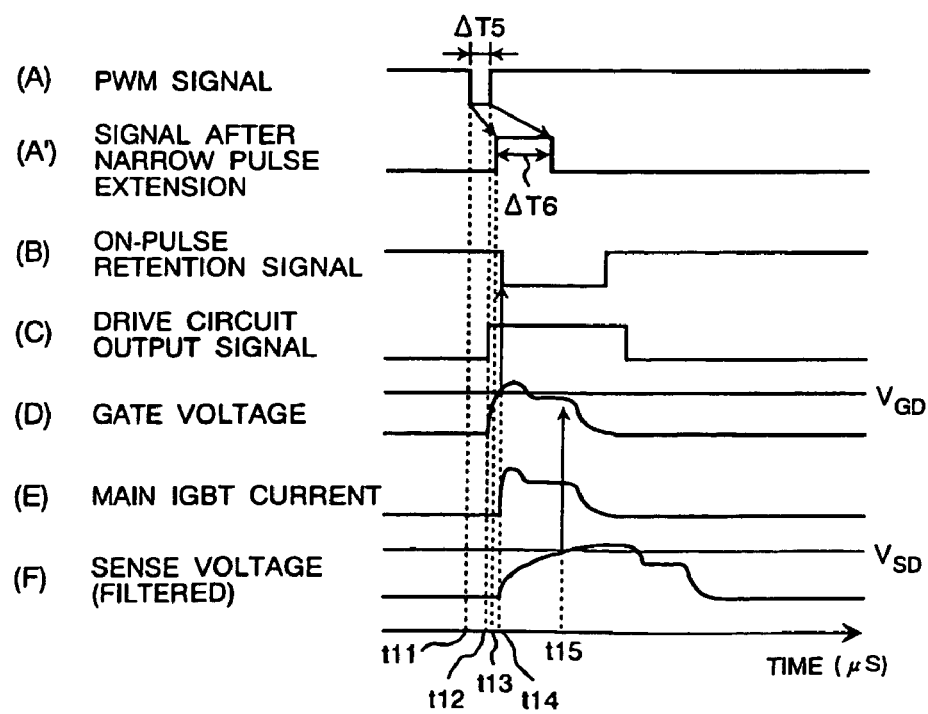
FIG. 10 is time chart showing the operation of the drive circuit of a switching device according to the seventh embodiment of the invention

Next, the construction and operation of the drive circuit of a switching device according to the seventh embodiment of the invention are described, using FIG. 9 and FIG. 10.

To begin with, the construction of the drive circuit of a switching device according to the seventh embodiment of the invention is described, using FIG. 9.

FIG. 9 is a circuit block diagram showing the construction of the drive circuit of the switching device according to the seventh embodiment of the invention. The same symbol as in FIG. 1 denotes the same part.

In this embodiment, there is provided a narrow pulse extension circuit 42 in addition to the construction shown in FIG. 1. The narrow pulse extension circuit 42 is to extend the pulse width of a short pulse signal, for example, shorter than 1 μs, to a longer width than 1 μs. The narrow pulse extension circuit 42 can be composed, for example, using a comparator.

Next, the operation of the drive circuit of the switching device according to this embodiment is described, using FIG. 10.

FIG. 10 is a time chart showing the operation of the drive circuit of the switching device according to the seventh embodiment of the invention. FIG. 10 shows the operation in the case where arm short circuit is caused when a narrow pulse is inputted. The horizontal axis of FIG. 10 represents the time. FIG. 10 (A) represents a PWM signal inputted to the drive circuit 21. FIG. 10 (A') represents a PWM signal outputted from the narrow pulse extension circuit 42. FIG. 10 (B) represents an ON-pulse retention signal outputted from the ON-pulse retention command circuit 11. FIG. 10 (C) represents an output signal of the drive circuit 21. FIG. 10 (D) represents the gate voltage of the IGBT 23. FIG. 10 (E) represents the main IGBT current through the IGBT 23. FIG. 10 (F) represents the sense voltage, an output of the filter circuit 26.

When a narrow pulse having the pulse width of ΔT5 is inputted at time t11 as shown in FIG. 10 (A), the narrow pulse extension circuit 42 extends the pulse width to ΔT6 (>ΔT5) and outputs it at time T13 as shown in FIG. 10 (A').

The output signal of the drive circuit 21 is made based on the logical OR of the PWM signal shown in FIG. 10 (A') and the ON-pulse retention signal shown in FIG. 10 (B), and the drive circuit output signal is set ON at time t13 as shown in FIG. 10 (C).

If arm short circuit is caused, the gate voltage exceeds the gate voltage detection level as shown in FIG. 10 (D), the gate voltage judgment comparator 16 judges as short-circuited, and an ON-pulse retention signal is outputted as shown in FIG. 10 (B). The drive circuit 21 determines the drive circuit output signal based on the logical OR of the PWM signal and ON-pulse retention signal. Consequently, as shown in FIG. 10 (C), it continues outputting the ON-pulse even after the PWM signal turns to an OFF command.

If the sense voltage exceeds the sense voltage detection level VSD, for example, at time t15 as shown in FIG. 10 (F), the short circuit judgment comparator 27 judges as short-circuited. Then, the soft cutoff command circuit 28 stops setting the drive circuit 21 ON/OFF, sets the nMOS 29 for soft cutoff ON, and decreases the gate voltage gradually by a resistor Rsf for soft cutoff. Because of this, the current trough the IGBT can be cut off slowly and the spike voltage defined by the product of the rate of current change—dI/dt at the cutoff and the stray inductance can be lowered as shown in FIG. 10 (E).

Thus, providing the gate voltage judgment comparator 16 and ON-pulse retention command circuit 11 makes it possible to surely protect the device from short circuit in the case of short circuit caused by a narrow pulse input.

In addition, providing the narrow pulse extension circuit 42 makes it possible to further improve the protection from short circuit in the case of a PWM signal having much narrower pulse width as shown in FIG. 10 (A). For example, in the case where the PWM signal rises at time t11 and falls at time t12 as shown in FIG. 10 (A), if the output signal of the drive circuit 21 is set ON at time t13 as shown in FIG. 10 (C) and set OFF at time later than time t13 but earlier than time t14 at which the ON-pulse retention signal is outputted, quick cutoff may possibly be caused to the IGBT because the ON-pulse retention signal has not yet been set ON by this time. Even in the above case, by extending the pulse width by the narrow pulse extension circuit 42, the drive circuit output signal can continue being ON, and hence the IGBT can be protected from breakdown.

With this embodiment, therefore, it is possible even in the case of short circuit caused by a narrower pulse signal input to further surely protect the device from short circuit.

According to the present invention, it becomes possible to operate a soft cutoff function when short circuit is detected and also to prevent the device from breakdown even if a narrow pulse is inputted.

What is claimed is:

1. A drive circuit for controlling a switching device ON/OFF, comprising:
    a short circuit detection means that detects short circuit of the switching device;
    a soft cutoff means that performs a soft-cutoff function by gradually decreasing the gate terminal voltage of the switching device when short circuit is detected by the short circuit detection means;
    wherein the switching device is one with voltage driven sense function, which is provided with a gate terminal, terminal No. 1, terminal No. 2, and terminal No. 3, with the main current applied between the terminal No. 1 and terminal No. 2 and the sense current in proportion to the main current is applied between the terminal No. 1 and terminal No. 3 by applying voltage to the gate terminal,
    a gate voltage detection means that detects the gate terminal voltage of the switching device; and
    an ON-pulse retention means that retains the drive circuit output ON when the gate terminal voltage detected by the gate voltage detection means exceeds a specified value and also the sense current of the switching device exceeds a specified value so that the soft cutoff function continues to operate when the short circuit is detected while preventing breakdown when a narrow pulse is inputted.

2. The drive circuit for a switching device according to claim 1, further comprising:
    a pulse width extension means that extends the pulse width of a pulse signal inputted to the drive circuit.

* * * * *